(12) United States Patent  
Yen et al.

(10) Patent No.: US 8,731,025 B2
(45) Date of Patent: May 20, 2014

(54) OFFSET PHASE-LOCKED LOOP TRANSMITTER AND METHOD THEREOF

(75) Inventors: Shih-Chieh Yen, Hsinchu Hsien (TW); Yao-Chi Wang, Hsinchu Hsien (TW); Ming-Yu Hsieh, Hsinchu Hsien (TW)

(73) Assignee: MStar Semiconductor, Inc. (TW)

( * ) Notice: Subject to any disclaimer, the term of this patent is extended or adjusted under 35 U.S.C. 154(b) by 503 days.

(21) Appl. No.: 12/911,071

(22) Filed: Oct. 25, 2010

(65) Prior Publication Data

US 2011/0122965 A1 May 26, 2011

(30) Foreign Application Priority Data

Nov. 23, 2009 (TW) .............................. 98139757 A

(51) Int. Cl.
*H04B 1/00* (2006.01)
*H04J 3/24* (2006.01)
*H04B 1/40* (2006.01)

(52) U.S. Cl.
USPC ............................ 375/133; 370/349; 455/76

(58) Field of Classification Search
USPC ......................................... 375/133; 370/349
See application file for complete search history.

(56) References Cited

U.S. PATENT DOCUMENTS

| 4,317,221 A * | 2/1982 | Toya ................................ 455/76 |
| 4,431,950 A * | 2/1984 | Bingaman ......................... 318/7 |
| 4,551,689 A * | 11/1985 | Scala et al. ........................ 331/2 |
| 4,725,852 A * | 2/1988 | Gamblin et al. ................ 347/75 |
| 4,901,036 A * | 2/1990 | Herold et al. .................... 331/25 |
| 5,036,291 A * | 7/1991 | Marz ............................. 329/325 |
| 5,079,768 A * | 1/1992 | Flammer ....................... 370/349 |
| 6,198,353 B1 * | 3/2001 | Janesch et al. .................. 331/16 |
| 6,466,634 B1 * | 10/2002 | O'Toole et al. ............... 375/374 |
| 6,573,769 B1 * | 6/2003 | Zhang et al. .................. 327/156 |
| 2001/0050555 A1 * | 12/2001 | Hawkins et al. .............. 324/204 |
| 2003/0231068 A1 * | 12/2003 | Humphreys .................... 331/17 |

* cited by examiner

*Primary Examiner* — Leon-Viet Nguyen
*Assistant Examiner* — Sarah Hassan
(74) *Attorney, Agent, or Firm* — Han IP Corporation

(57) ABSTRACT

An offset phase-locked loop (PLL) transmitter comprises a clock generator that generates a first clock signal; a detector that detects a phase difference between an input data signal and a feedback data signal to generate a control signal; a controlled oscillator, coupled to the detector, that generates an output data signal according to the control signal; a mixer, coupled to the controlled oscillator and the clock generator, that mixes the output data signal according to the first clock signal to generate the feedback data signal; and a control circuit, coupled to the detector and the controlled oscillator, that adjusts the operating frequency curve of the controlled oscillator by one of a first step distance and a second step distance smaller than the first step distance such that the control signal is substantially equal to a predetermined value.

6 Claims, 6 Drawing Sheets

OFFSET PHASE-LOCKED LOOP TRANSMITTER AND METHOD THEREOF

CROSS REFERENCE TO RELATED PATENT APPLICATIONS

This patent application claims priority from Taiwan Patent Application No. 098139757, filed in the Taiwan Patent Office on Nov. 23, 2009, entitled "Offset Phase-Locked Loop Transmitter and Method Thereof", and incorporates the Taiwan patent application in its entirety by reference.

TECHNICAL FIELD

The present disclosure relates to an offset phase-locked loop (PLL) transmitter and a method thereof, and more particularly, to an offset PLL transmitter and a method thereof capable of fast locking a phase to a target operating frequency curve from a plurality of operating frequency curves.

BACKGROUND OF THE PRESENT DISCLOSURE

Generally, an offset PLL is mainly applied to a signal transmitting end of a wireless communication system, e.g., the offset PLL is applied to a transmitter of a Global System for Mobile Communication (GSM) system. The offset PLL directly converts a to-be-transmitted data signal to a radio frequency (RF) signal, of which power is amplified via a power amplifier for transmission. In other words, in an offset PLL transmitter, the to-be-transmitted data signal is converted from an intermediate frequency (IF) signal to an RF signal without using a conventional up-convert mixer. Accordingly, the offset PLL transmitter is capable of avoiding broadband noises caused by the conventional up-convert mixer. The to-be-transmitted data signal is carried by a plurality of sub-bands with a predetermined bandwidth, and each of the sub-bands corresponds to a predetermined frequency. Therefore, upon receiving the to-be-transmitted data signal, the offset PLL locks with respect to a sub-band of the to-be-transmitted data signal to generate a corresponding RF data signal. In other words, the controlled oscillator of the offset PLL generates an oscillating signal having a corresponding oscillating frequency according to the sub-band of the to-be-transmitted data signal. Therefore, when the to-be-transmitted data signal is switched between the sub-bands, the oscillating frequency of the oscillating signal of the controlled oscillator is correspondingly switched. Accordingly, a problem of fast and stably switching the oscillating frequency of the controlled oscillator to a predetermined oscillating frequency to transmit the to-be-transmitted data signal needs to be solved.

SUMMARY OF THE PRESENT DISCLOSURE

An object of the present disclosure is to provide an offset PLL and a method thereof capable of fast and stably locking to a target operating frequency curve from a plurality of operating frequency curves.

According to a first embodiment of the present disclosure, an offset phase-locked loop (PLL) transmitter comprises a clock generator, for generating a first clock signal; a detector, for detecting a phase difference between an input data signal and a feedback data signal to generate a control signal; a controlled oscillator, coupled to the detector, for generating an output data signal according to the control signal; a mixer, coupled to the controlled oscillator and the clock generator, for mixing the output data signal according to the first clock signal to generate the feedback data signal; and a control circuit, coupled to the detector and the controlled oscillator, for adjusting the operating frequency curve of the controlled oscillator by one of a first step distance and a second step distance so that the control signal is substantially equal to a predetermined value.

According to a second embodiment of the present disclosure, a method for calibrating an operating frequency curve is applied to calibrate an operating frequency curve of a controlled oscillator of an offset PLL. The method comprises detecting a control signal of the controlled oscillator; comparing the control signal with a predetermined value; and changing the operating frequency curve of the controlled oscillator by a first step distance when the control signal is greater a predetermined value; changing the operating frequency curve of the controlled oscillator by a second operating frequency curve when the control signal is smaller than the predetermined value.

DETAILED DESCRIPTION OF THE PREFERRED EMBODIMENTS

Figure 1:
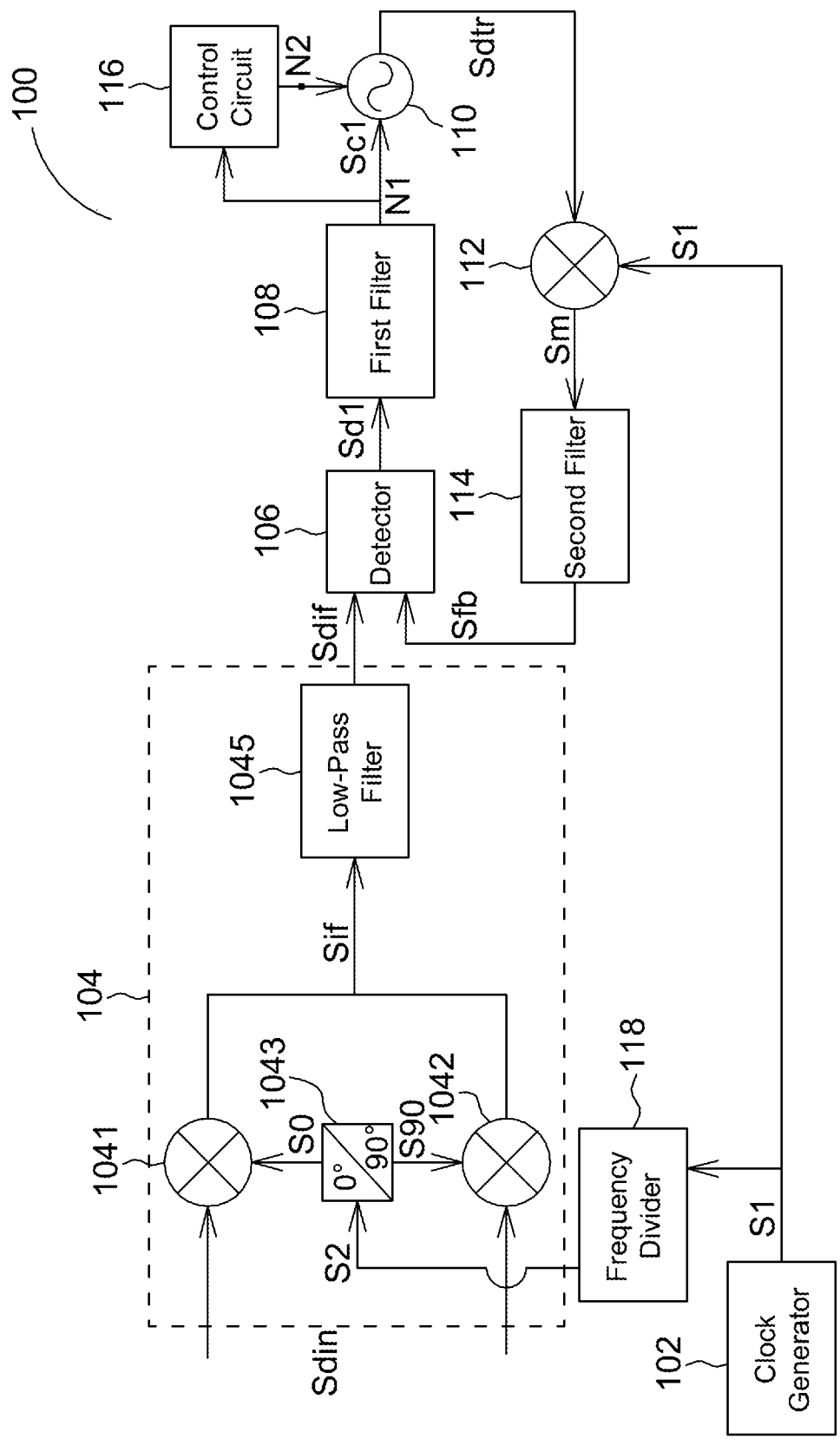
FIG. 1 is a schematic diagram of an offset PLL transmitter in accordance with an embodiment of the present disclosure.

FIG. 1 shows an offset PLL transmitter 100 in accordance with an embodiment of the present disclosure. The transmitter 100 comprises a clock generator 102, an IF mixing apparatus 104, a detector 106, a first filter 108, a controlled oscillator 110, a mixer 112, a second filter 114, and a control circuit 116. The clock generator 102 generates a first clock signal S1. The IF mixing apparatus 104 coupled to the clock generator 102 generates a second clock signal S2 according to the first clock signal to mix a to-be-transmitted data signal Sdin, so as to generate an IF data signal Sdif. For example, the second clock signal S2 is generated by a frequency divider 118 by frequency dividing the first clock signal S1. The detector 106 detects a phase difference between the IF data signal Sdif and an IF feedback signal Sfb to generate a detection result Sd1. The first filter 108 coupled to the detector 106 filters the detection result Sd1 to generate a control signal Sc1. The controlled oscillator 110 coupled to the first filter 108 generates an output data signal having an output frequency Ftr according to the control signal Sc1, e.g., an RF data signal Sdtr in FIG. 1. The mixer 112 coupled to the controlled oscillator 110 and the clock generator 102 mixes the RF data signal Sdtr according to the first clock signal S1 to down-converts the RF data signal to an IF band. The second filter 114 coupled to the mixer 112 filters the mixed RF data signal Sm to generate an IF feedback signal Sfb. The control circuit 116 coupled to the first filter 108 (i.e., an end point N1) and the controlled oscillator 110 (i.e., an end point N2) monitors the control signal Sc1, and adjusts an operating frequency curve of the controlled oscillator 110 according to the control signal Sc1. More specifically, the control circuit 116 adjusts the operating frequency curve of the controlled oscillator 110, so that the control signal Sc1 approximately equals a predetermined value Vp, and the adjustment process is divided into a coarse-adjusting stage and a fine-adjusting stage. In the coarse-adjusting stage, the control circuit 116 adjusts the operating frequency curve of the controlled oscillator 110 by a first step distance with a large step distance to fast approximate an accurate operating frequency curve. In the fine-tuning stage, the control circuit 116 adjusts the operating frequency curve of the controlled oscillator 110 by a second step distance with a small step distance. The first step distance is larger than the second step distance.

In this embodiment, the IF mixing apparatus 104 comprises a first mixer 1041, a second mixer 1042, a phase shifter 1043, and a low-pass mixer 1045. The phase shifter 1043 generates two clocks S0 and S90 having a phase difference of 90 degrees according to the second clock signal S2. The phase shifter 1043 may be replaced by a frequency divider to generate the two clocks S0 and S90 having the phase difference of 90 degrees. The first mixer 1041 and the second mixer 1042 mixes an IQ signal of a to-be-transmitted data signal Sdin according to the two clocks S0 and S90 to generate a synthetic IF output data Sif. The low-pass filter 1045 low-pass filters the synthetic IF output data Sif to generate the IF data signal Sdif.

Figure 2:
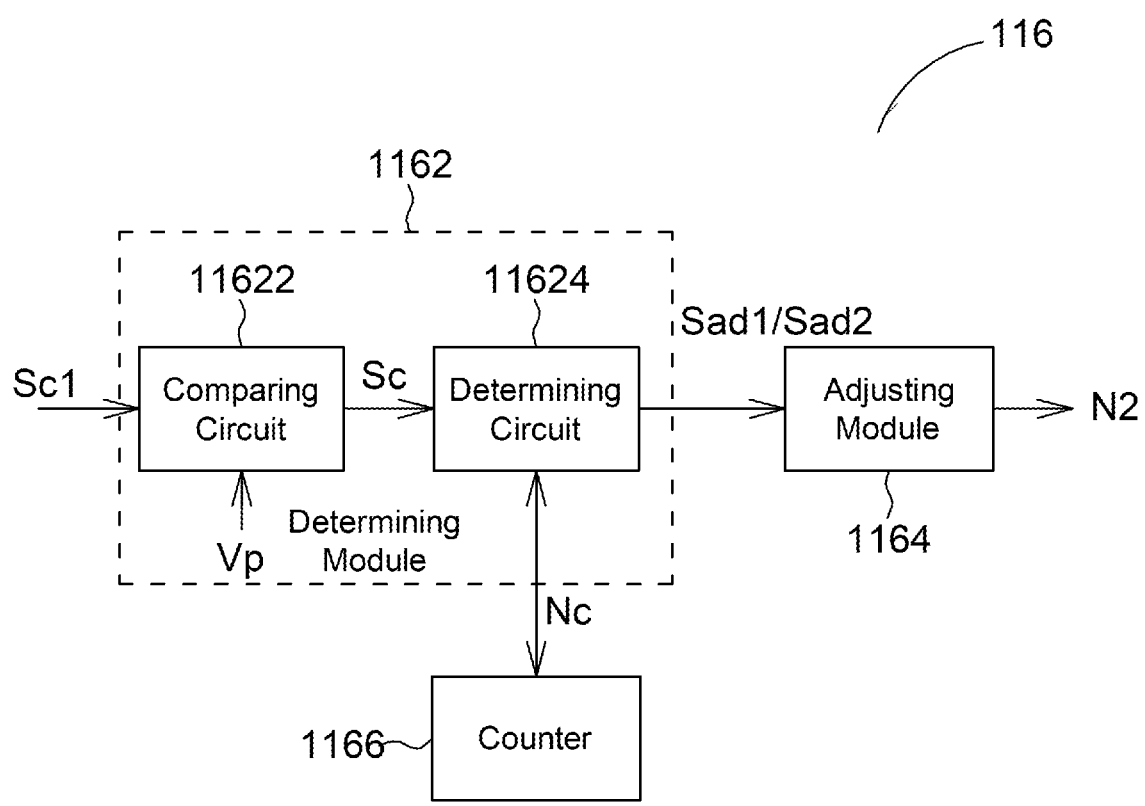
FIG. 2 is a schematic diagram of a control circuit of an offset PLL transmitter in accordance with an embodiment of the present disclosure.

In an embodiment, the control circuit 116 comprises a determining module 1162, an adjusting module 1164 and a counter 1166. FIG. 2 shows a schematic diagram of the control 116 of the offset PLL transmitter 100 in accordance with an embodiment of the present disclosure. The determining module 1162 coupled to the detector 106 detects or accesses the control signal Sc1, and generates a first adjustment signal Sad1 or a second adjustment signal Sad2 according to the control signal Sc1. The adjusting module 1164 changes once the operating frequency curve of the controlled oscillator 110 according to the first adjusting signal Sad1 or the second adjusting signal Sad2. More specifically, upon receiving the first adjustment signal Sad1, the adjusting module 1164 changes the operating frequency curve of the controlled oscillator 110 by the first step distance; upon receiving the second adjustment signal Sad2, the adjusting module 1164 changes the operating frequency curve of the controlled oscillator 110 by the second step distance. In addition, the counter 1166 records a count value Nc of a current operating frequency curve. Further, the determining module 1162 comprises a comparing circuit 11622 and a determining circuit 11624. The comparing circuit 11622 determines whether the control signal Sc1 is approximately equal to the predetermined value Vp, and generates a comparison result Sc. In other words, if the different between the control signal Sc1 and the predetermined value Vp is smaller than a threshold Vth, the comparing circuit 11622 generates a comparison result Sc representing positive. The determining circuit 11624 generates the first adjustment signal Sad1 or the second adjustment signal Sad2 according to the comparison result Sc and the count value Nc. In other words, when the comparison result Sc is negative, and the count value Nc is not substantially equal to a predetermined count value Np, the determining circuit 11624 generates the first adjustment signal Sad1 to the adjusting module 1164, which accordingly adjusts the operating frequency curve of the controlled oscillator 110 by the larger first step distance to fast approximate the accurate operating frequency curve. On the contrary, when the comparison result Sc is positive, and the count value Nc is substantially equal to the predetermined count value Np, the determining circuit 11624 generates the second adjusting signal Sad2 to the adjustment module 1164, so that the adjusting module 1164 adjusts the operating frequency curve of the controlled oscillator 110 by the smaller second step distance, so that the controlled oscillator 110 has the accurate operating frequency curve. It is to be noted that, the count value Nc for counting the current operating frequency curve is not a limitation of the present disclosure, and any method capable of recording the current operating frequency curve of the controlled oscillator 110 is within the scope of the present disclosure.

Figure 3:
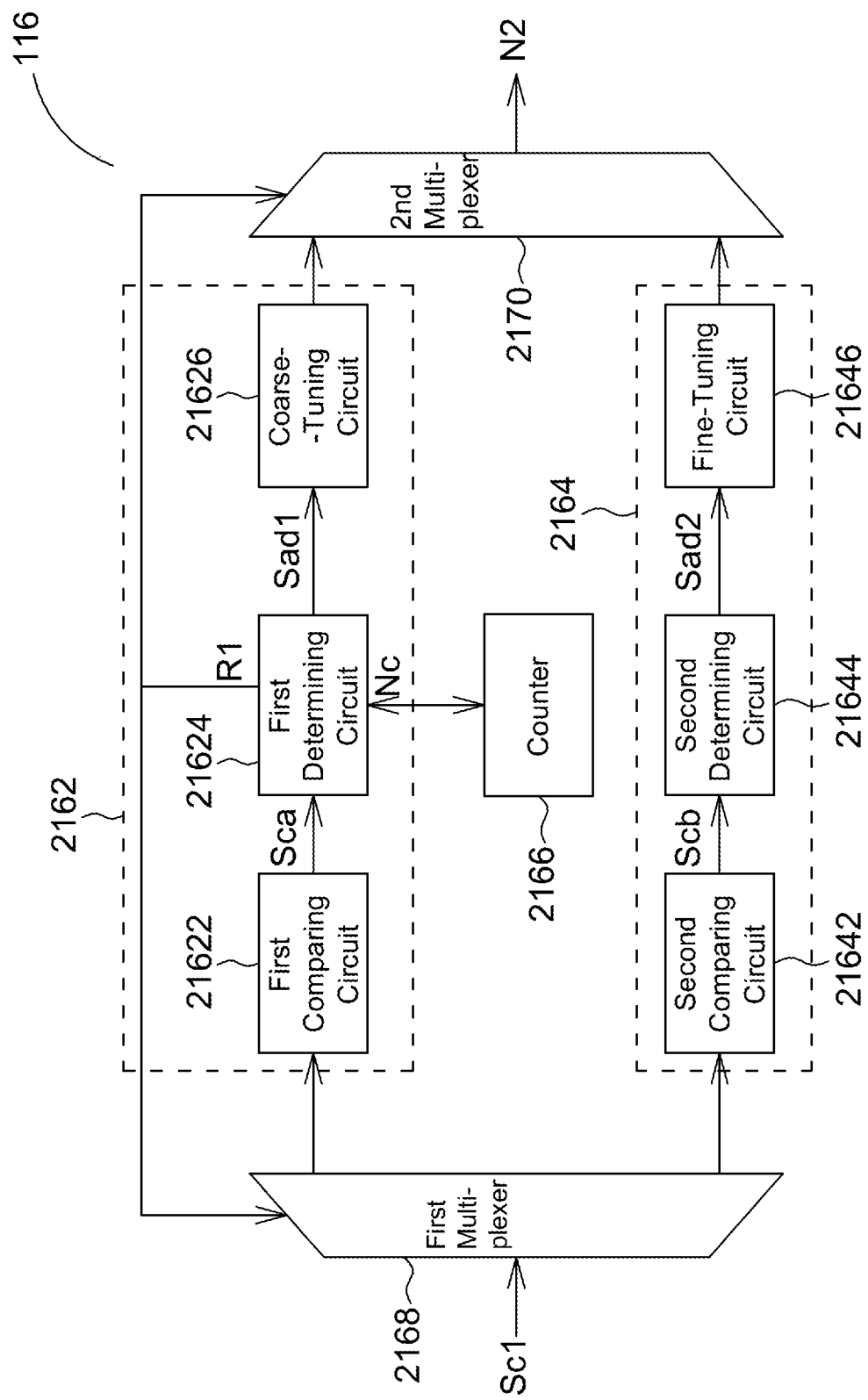
FIG. 3 is a schematic diagram of a control circuit of an offset PLL transmitter in accordance with an embodiment of the present disclosure.

In another embodiment, the control circuit 116 comprises a coarse-tuning module 2162, a fine-tuning module 2164, a first multiplexer 2168, and a second multiplexer 2170. FIG. 3 shows the circuit 116 of the offset PLL transmitter 100 in accordance with another embodiment of the present disclosure. The coarse-tuning module 2162 comprises a first comparing circuit 21622, a first determining circuit 21624, and a coarse-tuning circuit 21626. The fine-tuning module 2164 comprises a second comparing circuit 21642, a second determining circuit 21644, and a fine-tuning circuit 21646. The first comparing circuit 21622, the first determining circuit 21624, the second comparing circuit 21642, the second determining circuit 21644 and the counter 2166 form a determining module that generates the first adjustment signal Sad1 or the second adjustment signal Sad2 according to the control signal Sc1. The coarse-tuning circuit 21626 and the fine-tuning circuit 21646 form an adjusting module that changes once the operating frequency curve of the controlled oscillator 110 according to the first adjustment signal Sad1 or the second adjustment signal Sad2. Upon receiving the first adjustment signal Sad1, the coarse-tuning circuit 21626 changes the operating frequency curve of the controlled oscillator 110 by the first step distance. Upon receiving the second adjustment signal Sad2, the fine-tuning circuit 21646 changes the operating frequency curve of the controlled oscillator 110 by the second step distance. In the coarse-tuning stage, the first multiplexer 2168 transmits the control signal Sc1 to the first comparing circuit 21622, which determines whether the control signal Sc1 is approximately equal to the predetermined value Vp and generates a first comparison result Sca. The first determining circuit 21624 generates the first adjustment signal Sad1 or a first determination result R1 according to the first comparison result Sca and the count value Nc. In other words, when the first comparison result Sca is negative, and the count value Nc is not substantially equal to a predetermined count value Np, the first determining circuit 21624 generates the first adjustment signal Sad1 to the coarse-tuning circuit 21626, such that the adjusting module 1164 adjusts the operating frequency curve of the controlled oscillator 110 by the first step distance to fast approximate the accurate operating frequency curve. In the coarse-tuning stage, the second multiplexer 2170 transmits the first adjustment signal Sad1 to the end point N2. On the contrary, when the first comparison result Sca is positive, and the count value Nc is substantially equal to the predetermined count value Np, the first determining circuit 21624 generates the first determination result R1 to the first multiplexer 2168 and the second multiplexer 2170. At this point, in the fine-tuning stage, the first multiplexer 2168 transmits the control signal Sc1 to the second comparing circuit 21642, the second comparing circuit 21642 determines whether the control signal Sc1 is approximately equal to the predetermined value Vp, and generates a second comparison result Scb. The second determining circuit 21644 generates the second adjustment signal Sad2 according to the second comparison result Scb. In other words, when the second comparison result Scb is negative, the second determining circuit 21644 generates the second adjustment signal Sad2 to the fine-tuning circuit 21646, such that the adjusting module 1164 adjusts the operating frequency curve of the controlled oscillator 110 by the second step distance, so that the controlled oscillator 110 has the accurate operating curve. In the fine-tuning stage, the second multiplexer 2170 transmits the second adjustment signal Sad2 to the end point N2. Accordingly, the control circuit 116 adjusts the operating frequency curve of controlled oscillator 110 to fast approximate the accurate operating frequency curve in the fine-tuning stage, and gradually adjusts the operating frequency curve of the controlled oscillator 110 to the accurate operating frequency curve in the fine-tuning stage.

Figure 4:
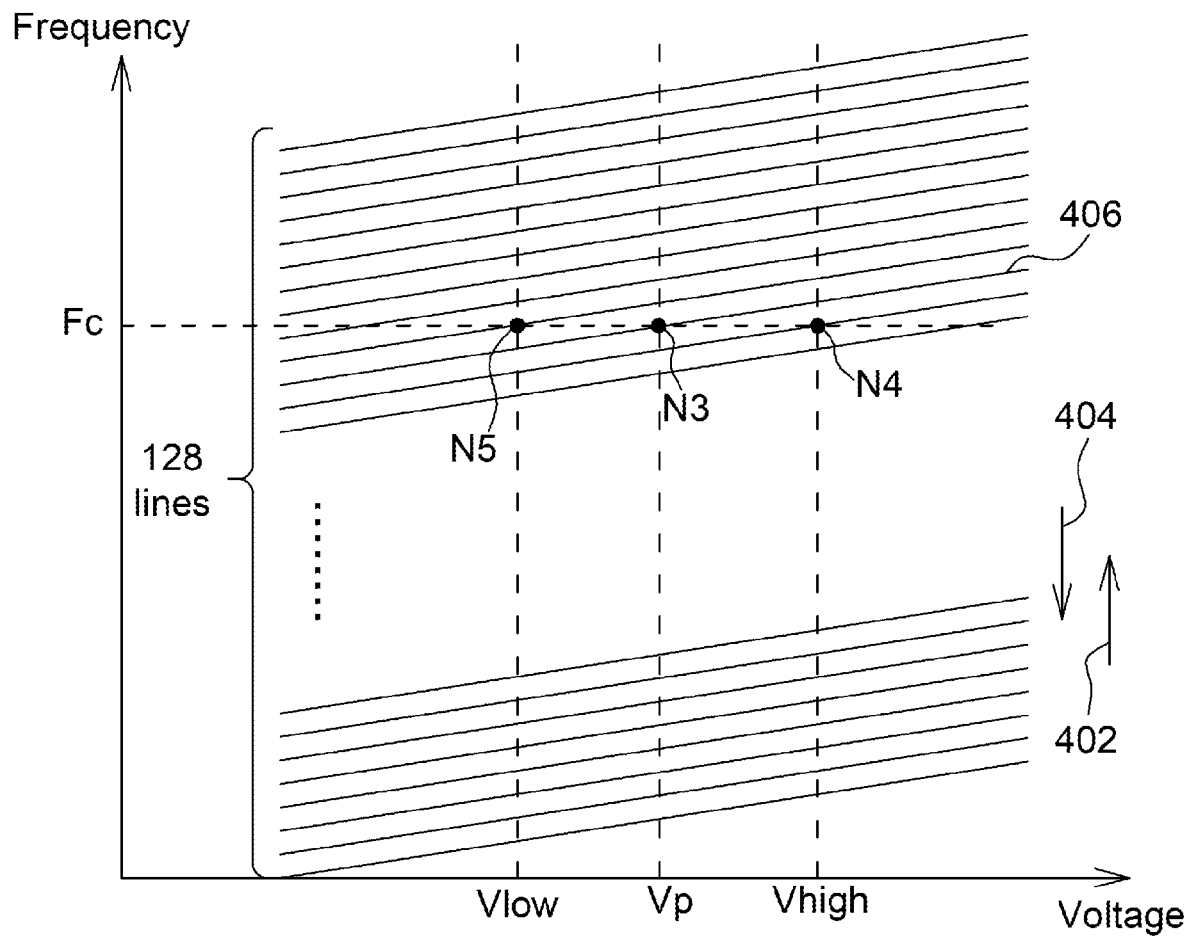
FIG. 4 is a schematic diagram of a plurality of candidate operating frequency curve of a controlled oscillator of an offset PLL transmitter in accordance with an embodiment of the present disclosure.
Figure 4:
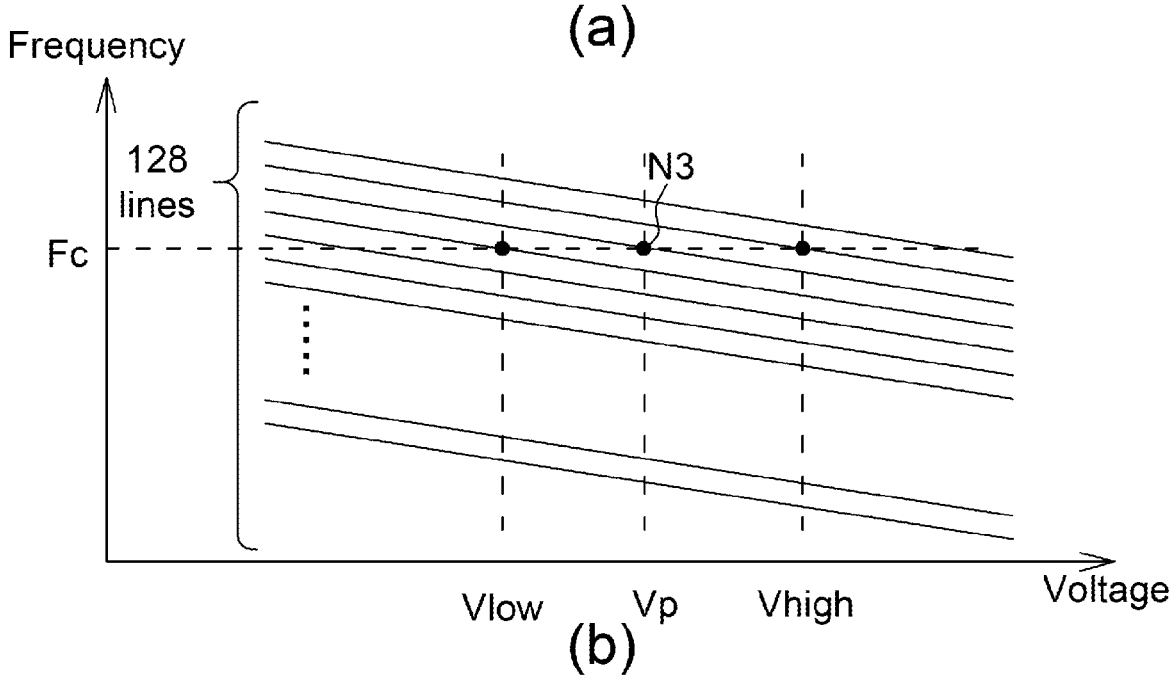

FIG. 4a and FIG. 4b shows schematic diagrams of a plurality of candidate operating frequency curves of the controlled oscillator 110 of the offset PLL transmitter 100 in accordance with an embodiment of the present disclosure. A difference between FIG. 4a and FIG. 4b is that a gain parameter Kvco in FIG. 4a is a positive slope, and a gain parameter Kvco in FIG. 4b is a negative slope. In this embodiment, there are 128 candidate operating frequency curves that could be selected by the controlled oscillator 110, i.e., each of the operating frequency curves corresponds to an RF sub-band. The control circuit 116 adjusts the operating frequency curve of the controlled oscillator 110 according to the control signal Sc1, so that the control signal Sc1 is approximately equal to the predetermined Vp to determine a best operating frequency curve of the controlled oscillator 110 thereby operating the offset PLL transmitter 100 at a predetermined frequency Fc. In other words, an object the present disclosure is to adjust the operating frequency curve of the oscillator 110 according to a sub-band needed by the to-be-transmitted data Sdin, so that the operating frequency curve of the controlled oscillator 110 may cover or approximately cover a cross point N3 of the oscillating frequency Fc and the predetermined value Vp as shown in FIG. 4a or FIG. 4b.

Figure 5:
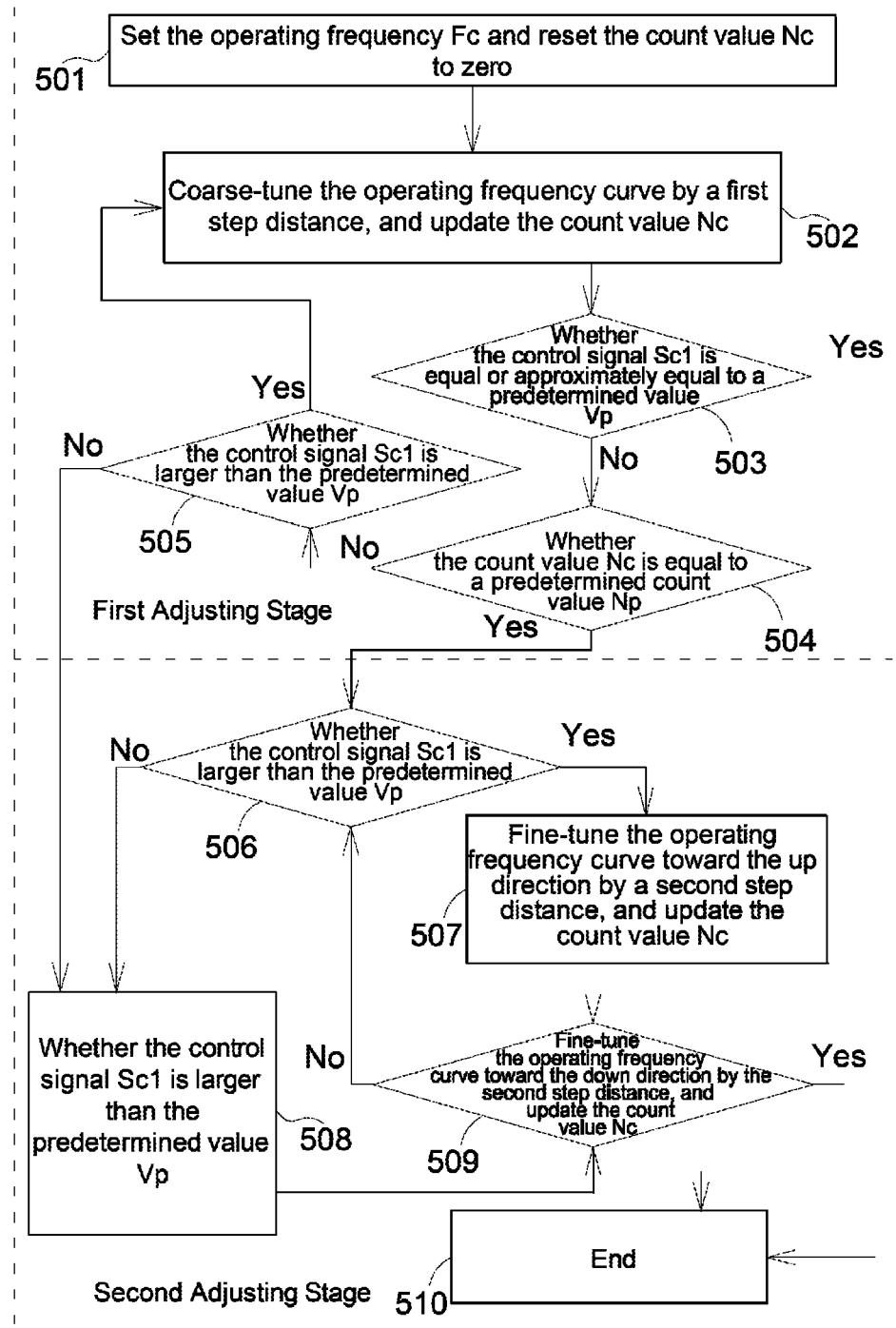
FIG. 5 is a flow chart of a method for adjusting by a control circuit an operating frequency curve of a controlled oscillator in a plurality of adjusting stages to approximately equal a control signal to a predetermined value in accordance with an embodiment of the present disclosure.

FIG. 5 shows a flow chart of a method 500 for adjusting by the control circuit 116 an operating frequency curve of the controlled oscillator 110 in accordance with an embodiment of the present disclosure. In this embodiment, supposing that a gain parameter Kvco of the controlled oscillator 110 has a positive slope (e.g., in FIG. 4a), the method comprises, but not limited to, a first adjusting stage and a second adjusting stage (i.e., the coarse-tuning stage and the fine-tuning stage). The first adjusting stage (i.e., the coarse-tuning stage) is to up-adjust the operating frequency curve by a large step distance (e.g., 10) from a lowest operating frequency curve (referring to FIG. 4a) until the control signal Sc1 is smaller than the predetermined value Vp. That is, when the current operating frequency curve is higher than a target operating frequency curve 406, the method enters the second adjusting stage. In the second adjusting stage (i.e., the fine-tuning stage), a small step distance (e.g., 1) is applied to adjust the operating frequency curve until the control signal Sc1 is approximately equal to the predetermined value Vp, i.e., the current operating frequency curve is the target operating frequency curve. For example, supposing that the controlled oscillator 110 has 128 operating frequency curves, and a 76th one is the best operating frequency curve 406. In the coarse-tuning stage, up-adjustment of the operating frequency curve is iterated for eight times by the large step distance 10, and the operating frequency curve is adjusted to the 80th operating frequency curve. At the time, the control signal Sc1 is smaller than the predetermined value Vp, then the method enters the fine-tuning stage. In the fine-tuning stage, down-adjustment of the operating frequency curve is iterated for four times by the small step distance 1 until the control signal Sc1 is equal to the predetermined Vp, and at this point, the current operating frequency curve is the target operating frequency curve 406. An exceptional situation is that, when the target operating frequency curve is within a final interval (e.g., the target operating frequency curve is the 123th operating frequency curve), the coarse-tuning stage ends in the 12th iteration, i.e., the 120th operating frequency curve, and after that, the operating frequency curve is up-adjusted until the 123th operating frequency curve is determined. Alternatively, the coarse-tuning stage ends in the 13th iteration, i.e., a largest 128th operating frequency curve, and after that, the operating frequency curve is down-adjusted until the 123th operating frequency curve is determined. The counter 2166 is used to record the number of coarse-tuning times in the coarse-tuning stage. More specifically, the method for adjusting the operating frequency curve of the controlled oscillator 110 comprises steps below.

In Step 501, the operating frequency Fc (i.e., a sub-band frequency of an RF data signal Sdtr) of the controlled oscillator 110 is set and the count value Nc is reset to zero (i.e., the count value Nc is a current operating frequency curve). In Step 502, the operating frequency curve of the controlled oscillator 110 is coarse-tuned by a first step distance, and the count value Nc is updated. In Step 503, it is determined whether the control signal Sc1 is substantially equal to a predetermined value Vp. When the determination result of Step 503 is positive, Step 510 is performed; otherwise, the flow proceeds to Step 504 in which it is determined that whether the count value Nc is equal to a predetermined count value Np. When determination result of Step 504 is positive, Step 506 is performed; otherwise, the flow proceeds to Step 505 in which it is determined whether the control signal Sc1 is larger than the predetermined value Vp. When the determination result of Step 505 is positive, Step 502 is performed; otherwise, Step 508 is performed. In Step 506, it is determined whether the control signal Sc1 is larger than the predetermined value Vp. When the determination result of Step 506 is positive, Step 507 is performed; otherwise, Step 508 is performed. In Step 507, the operating frequency curve of the controlled oscillator 110 is fine-tuned toward the up direction by a second step distance, the count value Nc is updated, and Step 509 is performed. In Step 508, the operating frequency curve of the controlled oscillator 110 is fine-tuned toward the down direction by the second step distance, the count value Nc is updated, and Step 509 is performed. In Step 509, it is determined whether the count signal Sc1 is approximately equal to the predetermined value Vp. When the determination result of the Step 509 is positive, Step 510 is performed; otherwise, the flow returns to Step 506. In Step 510, adjustment of the operating frequency curve of the controlled oscillator 110 is completed.

The following description is given with reference to FIG. 1 to FIG. 4. When the offset PLL transmitter 100 receives the to-be-transmitted data signal Sdin, the control signal 116 defines the operating frequency Fc of the controlled oscillator 110 and resets the count value Nc to zero before adjusting the controlled oscillator 110 to up approximates from the smallest operating frequency curve. Alternatively, the control signal 116 resets the count value to 128 to down-approximates from the largest operating frequency curve. The method and a circuit for realizing the method are readily apparent to a person having ordinary skills in the art after having read the foregoing disclosure, and shall not be described for brevity. It is to be noted that, in the fine-tuning stage, the control circuit 116 is not limited to approximating the target operating frequency curve 406 by regarding each of the operating frequency curves as one step, and any step smaller than the first step distance for adjusting the operating frequency curve of the controlled oscillator 110 is within the scope of the present disclosure.

Figure 6:
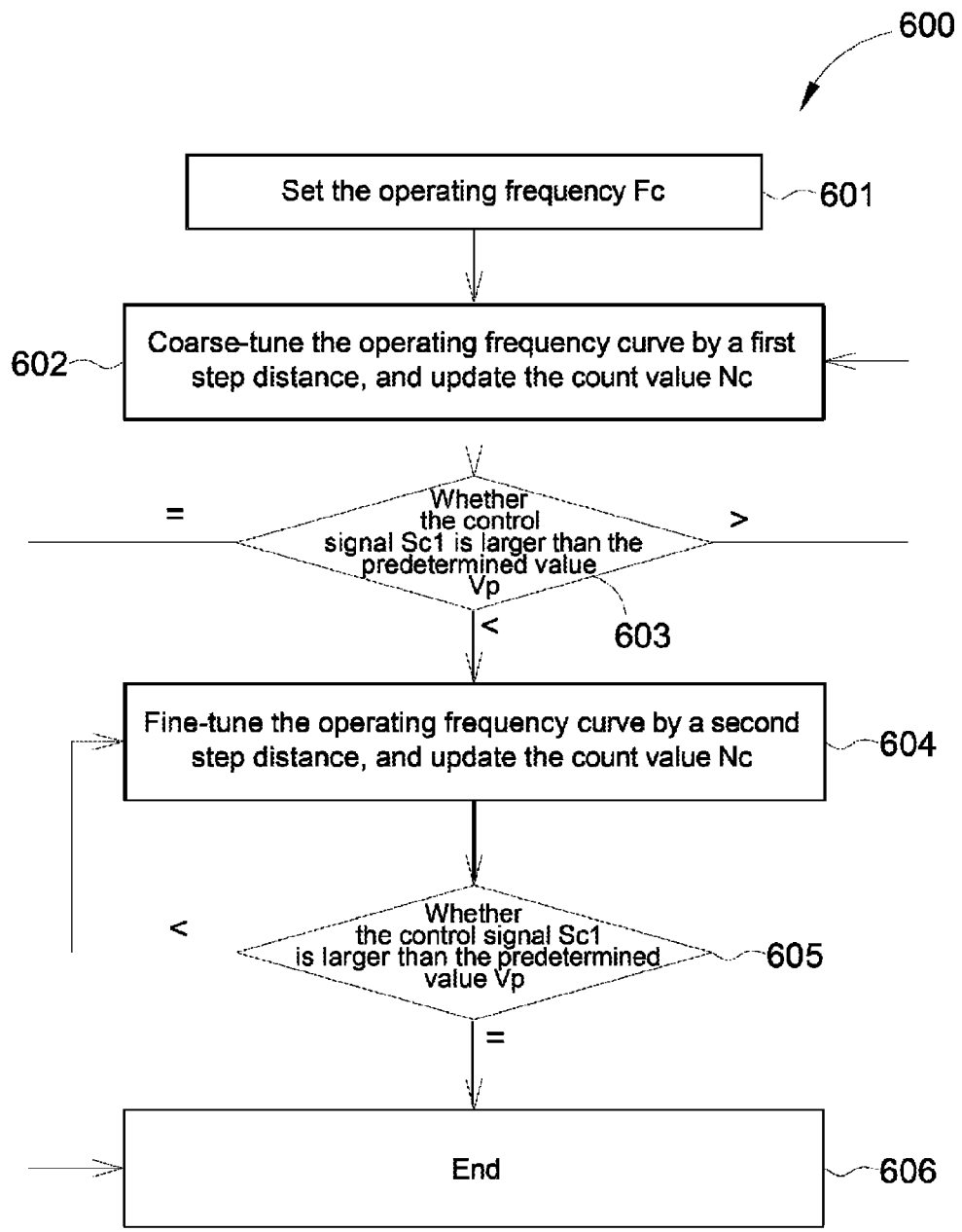
FIG. 6 is a flow chart of adjusting an operating frequency curve of a controlled oscillator in accordance with an embodiment of the present disclosure.

It is to be noted that, the method 500 for adjusting the operating frequency curve of the controlled oscillator 110 in FIG. 5 is only described according to an embodiment of the present disclosure, and is not a limitation of the present disclosure. FIG. 6 shows a flow chart of a method for adjusting the operating frequency curve of the controlled oscillator 110. A method 600 in FIG. 6 is only described according to another embodiment of the present disclosure. Compared with the method 500, the method 600 is simplified to steps below.

In Step 601, an operating frequency Fc (i.e., a sub-band frequency of an RF data signal Sdtr) of the controlled oscillator 110 is defined. In Step 602, the operating frequency curve of the controlled oscillator 110 is coarse-tuned by a first step distance. In Step 603, a control signal Sc1 is compared with a predetermined value Vp. When control signal Sc1 is approximately equal to the predetermined value Vp, Step 606 is performed; when the control signal Sc is larger than the predetermined value Vp, Step 602 is performed; when the control signal Sc1 is smaller than the predetermined value Vp, Step 604 is performed. In Step 604, the operating frequency curve of the controlled oscillator 110 is fine-tuned by a second step distance. In Step 605, the control signal Sc1 is compared with the predetermined value Vp. When the control signal Sc1 is smaller than the predetermined value Vp, Step 604 is performed; when the control signal Sc1 is approximately equal to the predetermined value Vp, Step 606 is performed. In Step 606, adjustment of the operating frequency curve of the controlled oscillator 110 is completed.

In Step 603, when the control signal Sc1 is equal to the predetermined value Vp at the beginning of the step, the current operating frequency curve is directly defined as the accurate operating frequency curve and completes adjusting the operating frequency curve of the controlled oscillator 110. When the control signal Sc1 is larger than the predetermined value Vp, the operating frequency curve of the controlled oscillator 110 is again coarse-tuned; otherwise, the operating frequency curve of the controlled oscillator 110 is again fine-tuned, and detailed operations thereof may be disclosed with reference to the description associated with the method 500 and shall not be described for brevity. It is to be noted that, although the operating frequency curve of the controlled oscillator 110 is up-adjusted from the lowest operating frequency curve (referring to FIG. 4) in the method 500 and the method 600, a person having ordinary skills in the art may know that, it is also properly designed to down-adjust from the highest operating frequency curve (referring to FIG. 4) to determine the target operating frequency curve—such modification is also within the scope of the present disclosure.

Therefore, in embodiments of the present disclosure (i.e., the first step distance is ten operating frequency curves per step, and the second step distance is one operating frequency curve per step), when it takes 1 μs for the control circuit 116 to change the operating frequency curve by the first step distance or the second step distance every time, the control circuit 116 at most needs 21 μs (at most 21 steps) to determine the target operating frequency curve 406 from the 128 operating frequency curves. Therefore, compared to a linear search approach applied by a conventional offset PLL transmitter, the offset PLL transmitter 100 according to the present disclosure is capable of faster determining the target operating frequency curve 406. Further, compared to a binary search approach applied by the conventional offset PLL transmitter, the offset PLL transmitter 100 according to the present disclosure is capable of more stably determining the target operating frequency curve 406 to avoid phase inversion of the offset PLL transmitter 100.

It is to be noted that, when the gain parameter Kvco of the controlled oscillator 100 has the negative slope (referring to FIG. 4b), the relationship between the determination result of the control signal Sc1 and the predetermined value Vp and the adjustment direction of the operating frequency curve may be inverse to those when the gain parameter Kvco of the controlled oscillator 110 has the positive slope, i.e., the relationship when the gain parameter Kvco of the controlled oscillator 110 has the negative slope is inverse to that in the description of FIG. 5 and FIG. 6. In addition, on top of being up-adjusting from the lowest operating frequency curve, the operating frequency curve is also down-adjusted from the highest frequency curve. The foregoing modifications are readily to a person having ordinary skills in the art after having read the description associated with FIG. 5 and FIG. 6, and shall not be described for brevity.

It is to be noted that, the method 500 and the method 600 according to the present disclosure are not limited to being realized by a control circuit 116 in FIG. 2 and FIG. 3. In other words, Step 501 to Step 510 and Step 601 to Step 606 are also realized by any circuit combinations. The control circuit 116 of the offset PLL transmitter 100 according to the present disclosure may adjust capacitances of the controlled oscillator 100 to adjust the operation frequency curve—such modification is readily to a person having ordinary skills in the art and shall not be described for brevity.

In conclusion, compared to the conventional offset PLL transmitter, the offset PLL transmitter 100 according to the present disclosure is capable of faster and more stably determining the target operating frequency curve 406 to lock and transmit one sub-band of a plurality of sub-bands of the received to-be-transmitted data Sdin.

While the disclosure has been described in terms of what is presently considered to be the most practical and preferred embodiments, it is to be understood that the present disclosure needs not to be limited to the above embodiments. On the contrary, it is intended to cover various modifications and similar arrangements included within the spirit and scope of the appended claims which are to be accorded with the broadest interpretation so as to encompass all such modifications and similar structures.

What is claimed is:

1. An offset phase-locked loop (PLL) transmitter, comprising:
 a clock generator that generates a first clock signal;
 a detector that detects a phase difference between an input data signal and a feedback data signal to generate a control signal;
 a controlled oscillator, coupled to the detector, that generates an output data signal according to the control signal;
 a mixer, coupled to the controlled oscillator and the clock generator, that mixes the output data signal according to the first clock signal to generate the feedback data signal; and
 a control circuit, coupled to the detector and the controlled oscillator, that adjusts an operating frequency curve of the controlled oscillator by one of a first step distance and a second step distance smaller than the first step distance such that the control signal is substantially equal to a predetermined value, wherein the control circuit comprises:

a determining module, coupled to the detector, that generates a first adjustment signal or a second adjustment signal according to the control signal;

an adjusting module that changes the operating frequency curve of the controlled oscillator once according to the first adjustment signal or the second adjustment signal, the adjusting module changing the operating frequency curve of the controlled oscillator by the first step distance upon receiving the first adjustment signal, or changing the operating frequency curve of the controlled oscillator by the second step distance upon receiving the second adjustment signal; and a counter that records a count value representing a current operating frequency curve, and wherein the determining module comprises:

a first comparing circuit that determines whether the control signal is substantially equal to the predetermined value to generate a first comparison result;

a first determining circuit, coupled to the first comparing circuit, that generates the first adjustment signal or a first determination result according to the first comparison result and the count value;

a second comparing circuit that determines whether the control signal is substantially equal to the predetermined value according to the first determination result to generate a second comparison result; and a second determining circuit, coupled to the second comparing circuit, that generates the second adjustment signal according to the second comparison result.

2. The transmitter as recited in claim 1, wherein the control circuit changes the operating frequency curve of the controlled oscillator by iterating the first step distance until the control signal is smaller than the predetermined value.

3. The transmitter as recited in claim 1, wherein the control circuit changes the operating frequency curve of the controlled oscillator by iterating the second step distance until the control signal is substantially equal to the predetermined value.

4. The transmitter as recited in claim 1, wherein when the first comparison result is negative and the count value is not equal to a predetermined count value, the first determining circuit generates the first adjustment signal, and wherein when the first comparison result is negative and the count value is equal to the predetermined count value, the first determining circuit generates the first determination result.

5. A method for calibrating an operating frequency curve of a controlled oscillator of an offset phase-locked loop (PLL), the method comprising:

detecting a control signal from the controlled oscillator;

generating a first adjustment signal or a second adjustment signal according to the control signal and a predetermined value; and adjusting, by a control circuit that is coupled to the controlled oscillator, the operating frequency curve of the controlled oscillator according to the first adjustment signal or the second adjustment signal, the first adjustment signal representing changing the operating frequency of the controlled oscillator by a first step distance, the second adjustment signal representing changing the operating frequency of the controlled oscillator by a second step distance smaller than the first step distance, wherein the generating comprises:

determining whether the control signal is substantially equal to the predetermined value to generate a first comparison result;

generating the first adjustment signal or a first determination result according to the first comparison result and a count value;

determining whether the control signal is substantially equal to the predetermined value to generate a second comparison result when the first determination result is generated; and generating the second adjustment signal according to the second comparison result.

6. The method as recited in claim 5, wherein when the first comparison result is negative and the count value is not equal to a predetermined count value, the first adjustment signal is generated, and wherein when the first comparison result is negative and the count value is equal to the predetermined count value, the first determination result is generated.

* * * * *